(12) United States Patent
Offterdinger

(10) Patent No.: US 8,584,525 B2
(45) Date of Patent: Nov. 19, 2013

(54) SENSOR COMPONENT

(75) Inventor: Klaus Offterdinger, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 438 days.

(21) Appl. No.: 12/707,896

(22) Filed: Feb. 18, 2010

(65) Prior Publication Data

US 2010/0242605 A1 Sep. 30, 2010

(30) Foreign Application Priority Data

Mar. 27, 2009 (DE) .......................... 10 2009 001 930

(51) Int. Cl.
*G01P 15/00* (2006.01)

(52) U.S. Cl.
USPC .......................................... 73/514.38; 73/526

(58) Field of Classification Search
USPC ................. 73/514.38, 493, 526, 530
See application file for complete search history.

(56) References Cited

U.S. PATENT DOCUMENTS

| | | | | |
|---|---|---|---|---|
| 2,260,417 A * | 10/1941 | Whiteley et al. | ............ | 508/456 |
| 4,500,447 A * | 2/1985 | Kobayashi et al. | ............ | 252/511 |
| 5,174,765 A * | 12/1992 | Williams et al. | ............ | 439/86 |
| 5,311,779 A * | 5/1994 | Teruo | ............ | 73/726 |
| 5,362,976 A * | 11/1994 | Suzuki | ............ | 257/81 |
| 6,121,675 A * | 9/2000 | Fukamura et al. | ............ | 257/680 |
| 6,441,503 B1 * | 8/2002 | Webster | ............ | 257/787 |
| 6,605,828 B1 * | 8/2003 | Schwarzrock et al. | ............ | 257/81 |
| 6,617,702 B2 * | 9/2003 | Hsu et al. | ............ | 257/797 |
| 6,798,053 B2 * | 9/2004 | Chiu | ............ | 257/684 |
| 6,885,099 B2 * | 4/2005 | Ogawa | ............ | 257/701 |
| 7,323,720 B2 * | 1/2008 | Kubota et al. | ............ | 257/84 |
| 7,464,603 B2 * | 12/2008 | Bauer et al. | ............ | 73/754 |
| 7,563,393 B2 * | 7/2009 | Hayakawa et al. | ............ | 252/500 |
| 7,732,915 B2 * | 6/2010 | Dangelmaier et al. | ............ | 257/704 |
| 7,915,076 B2 * | 3/2011 | Ogawa et al. | ............ | 438/106 |
| 7,964,954 B2 * | 6/2011 | Schmitt | ............ | 257/687 |
| 8,059,443 B2 * | 11/2011 | McLaren et al. | ............ | 365/64 |
| 8,064,739 B2 * | 11/2011 | Binkert et al. | ............ | 385/14 |
| 8,093,699 B2 * | 1/2012 | Kohara et al. | ............ | 257/684 |
| 8,401,347 B2 * | 3/2013 | Matsushima et al. | ............ | 385/14 |
| 2004/0214380 A1 * | 10/2004 | Leib et al. | ............ | 438/151 |
| 2007/0222005 A1 * | 9/2007 | Schmitt | ............ | 257/414 |
| 2008/0067477 A1 * | 3/2008 | Hayakawa et al. | ............ | 252/511 |
| 2008/0173097 A1 * | 7/2008 | Bauer et al. | ............ | 73/756 |

FOREIGN PATENT DOCUMENTS

DE 102006026878 12/2007

* cited by examiner

*Primary Examiner* — Peter Macchiarolo
*Assistant Examiner* — Samir M Shah
(74) *Attorney, Agent, or Firm* — Kenyon & Kenyon LLP

(57) ABSTRACT

A sensor component having a housing and a sensor chip situated in it. The sensor chip is connected mechanically to the housing via at least one elastomer element. In addition, the sensor chip is also connected electrically to the housing via the at least one elastomer element.

17 Claims, 2 Drawing Sheets

SENSOR COMPONENT

CROSS-REFERENCE

The present application claims the benefit under 35 U.S.C. §119 of German Patent Application No. 102009001930.8 filed Mar. 27, 2009, which is expressly incorporated herein by reference in its entirety.

FIELD OF THE INVENTION

The present invention relates to a sensor component.

BACKGROUND INFORMATION

Conventionally, a sensor, such as an acceleration sensor or a rotation-rate sensor, may be placed into a housing having integrated mechanical damping elements for mechanically decoupling outside influences, such as vibrations at the working frequency of the sensor. Such a model is described in German Patent Application No. DE 10 2006 026 878 A1, for instance. A spring-mass system is used for the vibration damping of the sensor, in this context. The spring-mass system is made up of a floor plate, which is connected to a frame of the housing via an elastomer element as the spring element, having self-damping for the dissipation of the vibrational energy.

In the conventional vibration-damped housings for sensor components, the mechanical contacting and the electrical contacting of the sensor chips situated in the housing are implemented via separate connecting techniques. The different connecting techniques for the electrical and mechanical contacting require a costly assembly and a certain minimum size of the sensor component. In addition, the separately executed electrical contacting is able to influence the damping properties of the sensor component negatively.

SUMMARY

It is an object of the present invention to provide an improved sensor component. This object may be attained by a sensor component according to example embodiments of the present invention.

An example sensor component according to the present invention has a housing and a sensor chip situated in it. The sensor chip is connected mechanically to the housing via at least one elastomer element, in this instance. In addition, the sensor chip is also connected electrically to the housing via the at least one elastomer element.

The elastomer element advantageously effects a mechanical decoupling of the sensor chip from interferences, such as vibrations, affecting the housing. External vibrations are damped by the elastomer element. This is particularly advantageous in the case of external interferences, whose frequencies are close to the working frequency of the sensor chip. Since the elastomer element is also used for the electrical connection of the sensor chip, additional electrical contacts may be omitted. A negative influence on the damping properties of the sensor component is avoided thereby. In addition, the design of the example sensor component according to the present invention requires fewer process steps than is the case with sensor components up to now, which reduces manufacturing costs.

According to one refinement of the sensor component, the sensor component is situated on a substrate. The substrate, in this instance, has at least one electrical plated-through hole to which the sensor chip is electrically connected. The substrate is situated in the housing in such a way that the plated-through hole lies against the elastomer element, and is electrically connected to the elastomer element, the elastomer element being also connected electrically to a contact element of the housing. This additionally simplifies the production of the sensor component. The sensor chip may be provided on one side of the substrate and the elastomer element on the other side. For the connection of the sensor chip to the substrate, advantageously both bonding wires and flip chip technique may be used. The substrate is expediently a printed circuit board.

According to one specific embodiment, the sensor chip is connected electrically to the plated-through hole via at least one bonding wire. According to another specific embodiment, the sensor chip is connected electrically to the plated-through hole via at least one solder pad. This advantageously permits making a flip chip assembly of the sensor chip.

In one refinement of the sensor component, an additional mass may be situated on the substrate. This has the advantage that the resonant frequency of the system formed from the substrate and the elastomer element is reduced, whereby the damping is improved.

In another refinement of the sensor component, the substrate is pressed against the elastomer element by at least one holding-down element. In addition, the holding-down element is able to produce an electrical connection between a ground contact of the substrate and a ground contact of the housing. This specific embodiment advantageously permits a symmetrization of the clamping of the substrate, whereby the excitation of additional interference modes is prevented. In addition, an advantageous EMC screening of the sensor component is achieved.

According to one specific embodiment, the elastomer element has a plurality of conductive and insulating layers. Such elastomer elements are advantageously obtainable inexpensively. In another specific embodiment, the elastomer element has a silicone and conductive particles or filaments integrated into the silicone. This permits better contacting and makes possible lower contact resistances. According to one additional alternative specific embodiment, the elastomer element is produced from conductive, extrudable silicone. This advantageously enables an especially simple production of the sensor component.

The substrate is preferably connected to the elastomer element by a first conductive adhesive connection. The elastomer element is also preferably connected to the housing by a second conductive adhesive connection.

In the following, the present invention is explained in detail with reference to the figures. Uniform reference numerals are used for parts that are the same or act the same, in this context.

DETAILED DESCRIPTION OF EXAMPLE EMBODIMENTS

Figure 1:
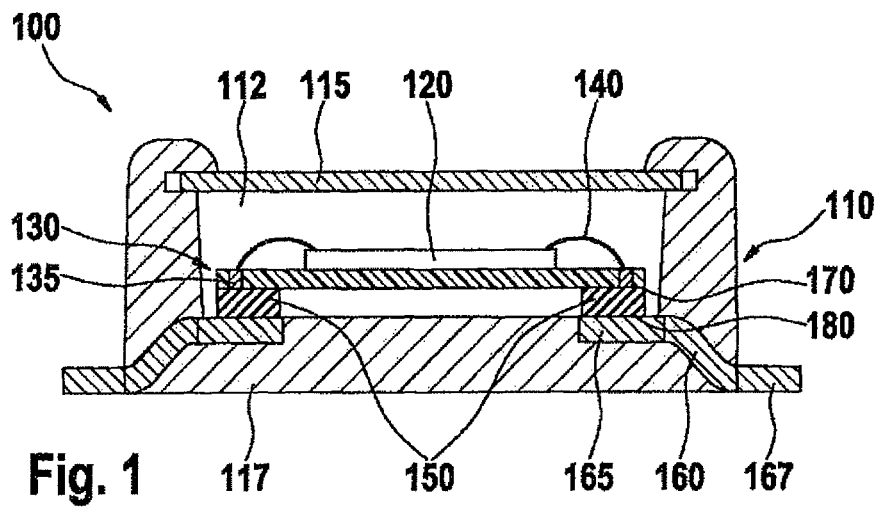
FIG. 1 shows a section through a sensor component according to a first specific embodiment.

FIG. 1 shows a schematic representation of a section through a sensor component 100, according to a first specific embodiment. Sensor component 100 includes a housing 110 which encloses a sensor chamber 112 between a cover 115 and a floor 117 of the housing 110. Housing 110 may be a premold housing, for example.

A sensor chip 120 is situated in sensor chamber 112 within housing 110. Sensor chip 120 may have a micromechanical sensor, for instance, an acceleration sensor or a rotation-rate sensor. Sensor chip 120 may also have another type of sensor. On sensor chip 120, evaluation electronics, for instance in the form of ASICs, may already be provided.

Sensor chip 120 is situated on a substrate 130. Substrate 130 may be a printed circuit board, for example. In the exemplary embodiment of FIG. 1, sensor chip 120 is situated on substrate 130 in such a way that the active sensor components of sensor chip 120 are provided on the side of sensor chip 120 facing away from substrate 130. Sensor chip 120 may, for instance, be fastened on substrate 130 using an adhesive. Substrate 130 has a plurality of plated-through holes 135, which produce an electrical connection between the upper side and the lower side of substrate 130. Sensor chip 120 is electrically connected to plated-through holes 135 of substrate 130 via a plurality of bonding wires 140. In one alternative specific embodiment of the present invention, sensor chip 120 may be situated on the substrate in such a way that the active sensor components of sensor chip 120 are situated on the surface of sensor chip 120 facing substrate 130. In this specific embodiment, the electrical connections between sensor chip 120 and plated-through holes 135 of substrate 130 are preferably produced by solder pads. This permits making a flip chip assembly of sensor chip 120 on substrate 130.

Floor 117 of housing 110 has a plurality of contact elements 160. Each contact element 160 includes an inner contact area 165 situated in sensor chamber 112 and an outer contact pin 167, which are electrically connected to each other. Outer contact pins 167 are used for the electrical contacting of sensor component 100.

Substrate 130 is connected to floor 117 of housing 110 via a plurality of conductive elastomer elements 150. Each conductive elastomer element 150 produces an electrical and a mechanical connection between a plated-through hole 135 of substrate 130 and an inner contact area 165 of a contact elements 160. In this context, each elastomer element 150 may be connected by a first conductive adhesive connection 170 to substrate 130 and by a second conductive adhesive connection 180 to an inner contact area 165 on floor 117 of housing 110.

Elastomer elements 150 are conductive and elastic, and effect a mechanical and an electrical coupling of substrate 130 along with sensor chip 120, located on it, to housing 110 of sensor component 100. Because of their elasticity, elastomer elements 150 act, in this instance, as spring elements at the same time, having intrinsic damping, which decouple substrate 130, along with sensor chip 120 located on it, from interfering vibrations of housing 110.

Figure 2:
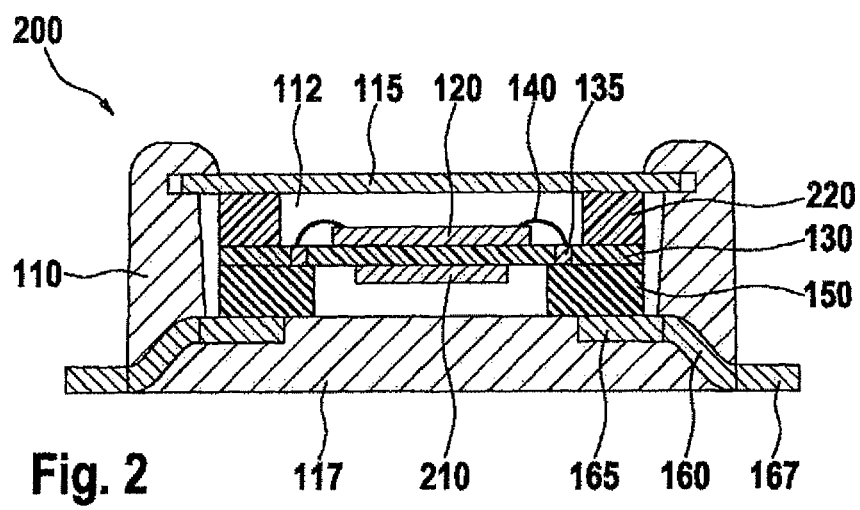
FIG. 2 shows a section through a sensor component according to a second specific embodiment.

FIG. 2 shows a schematic representation of a section through a sensor component 200, according to a second specific embodiment. Sensor component 200 also includes a housing 110 having a floor 117 and a cover 115, between which a sensor chamber 112 is situated inside the housing 110. In sensor component 200 there is also situated a sensor chip 120, on a substrate 130, having plated-through holes 135. The electrical contacting of sensor chip 120 to substrate 130 may be performed via bonding wires 140, as in FIG. 1, or in flip chip technique, via solder pads. In the specific embodiment of FIG. 2, housing 110 also has a plurality of contact elements 160 having inner contact areas 165 and outer contact pins 167. In sensor component 200 of FIG. 2, there is also provided a plurality of elastomer elements 150 between substrate 130 and floor 117 of housing 110, which produce electrical connections between plated-through holes 135 of substrate 130 and inner contact areas 165 of contact elements 160, and connect substrate 130 mechanically to housing 110.

In addition, FIG. 2 shows a plurality of holding-down elements 220, that are situated between substrate 130 and cover 115 of housing 110. These holding-down elements 220 are also developed to be elastic and may be made of silicone, for example. Via holding-down elements 220, cover 115 of housing 110 exerts a force on substrate 130, which presses substrate 130 against elastomer elements 150 and floor 117 of housing 110. Consequently, substrate 130 is clamped in elastically between cover 115 and floor 117 of housing 110 by holding-down elements 220 and elastomer elements 150.

In one particularly preferred specific embodiment, holding-down elements 220 are also electrically conductive. In this case, holding-down elements 220 may effect an electrical ground linking of substrate 130 to housing 110, whereby an advantageous EMC screening of sensor component 200 is achieved. For this purpose, holding-down elements 220 effect an electrical connection between a ground contact of substrate 130 and a ground contact of cover 115. The ground contact of substrate 130 may also be connected to a ground contact of sensor chip 120.

As in the specific embodiment of FIG. 1, a first conductive adhesive connection 170 may exist between substrate 130 and elastomer elements 150 and a second conductive adhesive connection 180 may exist between elastomer elements 150 and inner contact areas 165. Alternatively, however, first and second conductive adhesive connection 170, 180, in the specific embodiment of FIG. 2, may be omitted.

Holding-down elements 220 may be laid in individually during the assembly of sensor component 200, or may even be connected to cover 115 of housing 110 in a preceding process step, for instance, extruded on. The mounting of cover 115 on housing 110 may then be performed by hot calking, by clipping in, by laser transmission welding or by using another technique.

The specific embodiment of sensor component 200, shown in FIG. 2, offers the advantage that both surfaces of substrate 130 are clamped in. Thereby one may avoid stresses of substrate 130 which could generate excitable, additional interference modes by an unfavorable position of the center of mass.

Sensor component 200 shown in FIG. 2 has an additional component 210, which is situated on the surface of substrate 130, that lies opposite to sensor chip 120, facing floor 117. The additional component 210 may be an additional sensor chip, another electronic or passive component, or an additional mass. Additional component 210 may be connected electrically to sensor chip 120 via additional plated-through holes in substrate 130. Additional component 210 may effect an additional symmetrization of substrate 130, and may thereby also contribute to a suppression of interference modes. Additional component 210 may also be omitted, however.

Figure 3:
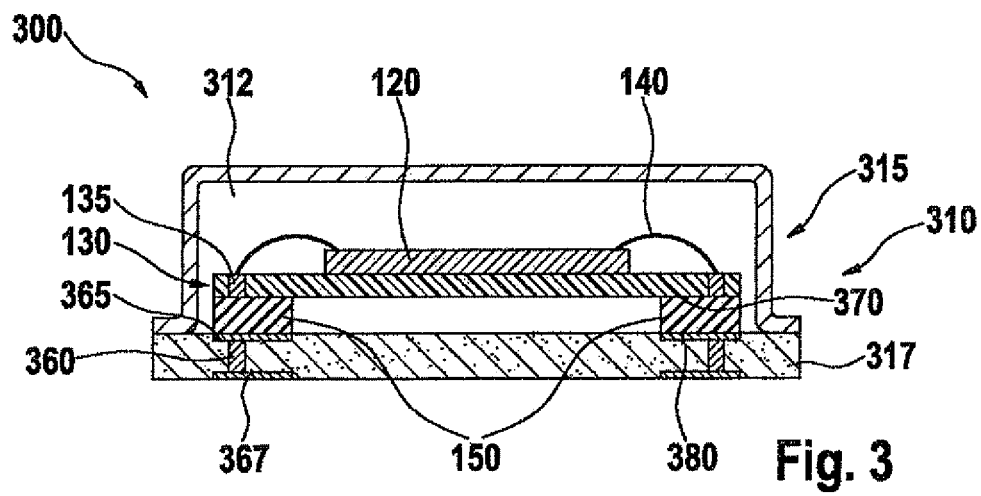
FIG. 3 shows a section through a sensor component according to a third specific embodiment.

FIG. 3 shows a schematic view of a section through a sensor component 300, according to a third specific embodiment. Sensor component 300 includes a housing 310, which is made up of cover 315, situated over a floor substrate 317, which encloses a sensor chamber 312. Floor substrate 317 may be, for example, a printed circuit board or a silicon substrate. Floor substrate 317 has a plurality of plated-through holes 360.

Each plated-through hole 360 produces an electrical connection between an inner contact area 365 in sensor chamber 312 and an outer contact area 367 on the surface of floor substrate 317 lying opposite to sensor chamber 312, In sensor chamber 312 a substrate 130 is situated, having plated-through holes 135 and a sensor chip 120 fastened to it. Sensor chip 120 may be connected via a plurality of bonding wires 140, or by solder pads, in flip chip technique, electrically to plated-through holes 135 of substrate 130.

Substrate 130 is connected to floor substrate 317 via a plurality of elastomer elements 150. Each elastomer element 150 produces an electrical and a mechanical connection between a plated-through hole 135 in substrate 130 and an inner contact area 365 of a plated-through hole 360 in floor substrate 317. Substrate 130 may be connected to elastomer elements 150 via first conductive adhesive connections 370. Elastomer elements 150 may be connected to floor substrate 317 via second conductive adhesive connection 380. The elasticity of conductive elastomer elements 150, just as in the case of sensor components 100, 200 in FIGS. 1 and 2, acts to decouple substrate 130, along with sensor chip 120, from vibrations of housing 310.

One advantage of the specific embodiment of FIG. 3 is that, in a first process step, a plurality of substrates 130 and sensor chips 120 are able to be mounted on a large floor substrate 317. Only after a cover 315 has been placed over each sensor chip 120 are the several sensor components 300, thus created, cut apart, for instance, by sawing apart floor substrate 317 into separate sensor components 300. This reduces manufacturing costs.

Figure 4:
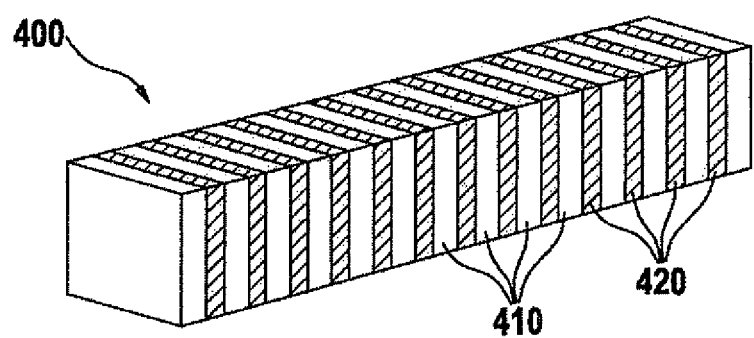
FIG. 4 shows a schematic view of a specific embodiment of an elastomer element.

In a schematic view, FIG. 4 shows a conductive elastomer element 400, that is suitable for use in sensor components 100, 200, 300 of FIGS. 1 to 3. Elastomer element 400 has a layered construction that has a plurality of conductive layers 410 and insulating layers 420, which alternate with each other. Such elastomer elements may be semiconducting rubber or zebra. Insulating layers 420 may be made of rubber. Conductive layers 410 may, for instance, also be made of rubber into which conductive particles, such as graphite particles or soot particles are integrated. Individual layers 410, 420 of elastomer element 400 are so narrow that, when elastomer element 400 is used in a sensor component 100, 200, 300, each plated-through hole 135 and each contact area 165, 365 is in contact with a plurality of conductive layers 410. Elastomer element 400 thereby makes possible the production of a conductive and an elastic connection.

In alternative specific embodiments that are not shown, elastomer elements 150 of sensor components 100, 200, 300 are made of a silicone into which conductive particles or filaments are incorporated. Elastomer elements 150 may, for instance, be made of silicone including gold-coated brass filaments. Such elastomer elements have the advantage, over elastomer elements 400 in FIG. 4, that they have lower contact resistance.

In a further specific embodiment that is not shown, elastomer elements 150 of sensor components 100, 200, 300 are made of conductive, extrudable silicone. In this specific embodiment, the elastomer elements 150 may be produced by direct extrusion of the conductive silicone onto floor elements and cover elements 117, 317, 115, 315.

What is claimed is:

1. A sensor component comprising:
a housing having at least one electrical contact element;
a sensor chip affixed to a substrate having at least one plated-through hole, the sensor chip being electrically connected to the at least one plated-through hole and situated in the housing; and
at least one elastomer element mechanically connecting the substrate to the housing and providing a wireless electrical connection between the at least one plated-through hole and the at least one electrical contact element.

2. The sensor component as recited in claim 1, wherein the substrate is situated in the housing in such a way that the at least one plated-through hole lies against the at least one elastomer element.

3. The sensor component as recited in claim 2, wherein the substrate is pressed against the elastomer element by at least one elastic holding-down element.

4. The sensor component as recited in claim 3, wherein the holding-down element produces an electrical connection between a ground contact of the substrate and a ground contact of the housing.

5. The sensor component as recited in claim 2, wherein the substrate is connected to the elastomer element by a first conductive adhesive connection.

6. The sensor component as recited in claim 5, wherein the elastomer element is connected to the housing by a second conductive adhesive connection.

7. The sensor component as recited in claim 1, wherein the sensor chip is connected electrically to the plated-through hole via at least one bonding wire.

8. The sensor component as recited in claim 1, wherein the sensor chip is connected electrically to the plated-through hole via at least one solder pad.

9. The sensor component as recited in claim 1, wherein the substrate is a printed circuit board.

10. The sensor component as recited in claim 1, wherein a mass is situated on the substrate.

11. The sensor component as recited in claim 1, wherein the elastomer element has a plurality of conductive and insulating layers.

12. The sensor component as recited in claim 1, wherein the elastomer element has silicone and one of conductive particles or conductive filaments incorporated into the silicone.

13. The sensor component as recited in claim 1, wherein the elastomer element is produced from conductive, extrudable silicone.

14. The sensor component of claim 1, wherein the at least one elastomer element mechanically and electrically connects the at least one plated-through hole of the substrate to an inner contact area of the at least one electrical contact element affixed to the housing.

15. A sensor component comprising:
a housing having at least one electrical contact element;
a substrate situated in the housing and having at least one plated-through hole extending between a first side and a second side of the substrate;
a sensor chip situated on the first side of the substrate and having an output for outputting an electrical signal that is electrically contacted to the at least one plated-through hole; and
at least one elastomer element providing a mechanical and an electrical connection between the at least one plated-through hole on the second side of the substrate and the at least one electrical contact element.

16. The sensor component of claim 15, further comprising:
a plurality of sensor chip outputs, electrical contact elements, plated-through holes, and elastomer elements, wherein each sensor chip output outputs a different electrical signal, each sensor chip output is electrically contacted to a different plated through-hole, each plated-through hole is mechanically and electrically connected to a different electrical contact element by a different elastomer element.

17. The sensor component of claim 15, wherein the at least one elastomer element provides a wireless electrical connection between the at least one plated-through hole of the substrate and the at least one electrical contact element.

* * * * *